United States Patent
Tanizawa et al.

(10) Patent No.: US 11,520,319 B2
(45) Date of Patent: Dec. 6, 2022

(54) BASE BOARD PRODUCTION LINE, INFORMATION MANAGEMENT DEVICE, AND INFORMATION MANAGEMENT PROXY DEVICE

(71) Applicant: FUJI CORPORATION, Chiryu (JP)

(72) Inventors: Yoshiharu Tanizawa, Toyota (JP); Toshiya Suzuki, Toyota (JP); Masahiro Takeda, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 407 days.

(21) Appl. No.: 16/629,652

(22) PCT Filed: Jul. 10, 2017

(86) PCT No.: PCT/JP2017/025124
§ 371 (c)(1),
(2) Date: Jan. 9, 2020

(87) PCT Pub. No.: WO2019/012577
PCT Pub. Date: Jan. 17, 2019

(65) Prior Publication Data
US 2020/0166916 A1 May 28, 2020

(51) Int. Cl.
*G05B 19/41* (2006.01)
*G05B 19/418* (2006.01)
(Continued)

(52) U.S. Cl.
CPC ... *G05B 19/41865* (2013.01); *H05K 13/0882* (2018.08); *G05B 2219/36195* (2013.01)

(58) Field of Classification Search
CPC .... G05B 19/41865; G05B 2219/36195; H05K 13/0882; H05K 13/00
(Continued)

(56) References Cited

U.S. PATENT DOCUMENTS 6,718,629 B1 4/2004 Stanzl
2015/0296629 A1 10/2015 Yamazaki et al.
(Continued)

FOREIGN PATENT DOCUMENTS

CN 105813447 A 7/2016
JP 62-166599 A 7/1987
(Continued)

OTHER PUBLICATIONS

International Search Report dated Oct. 3, 2017 in PCT/JP2017/025124 filed Jul. 10, 2017, 2 pages.

*Primary Examiner* — Michael J Brown
(74) *Attorney, Agent, or Firm* — Oblon, McClelland, Maier & Neustadt, L.L.P.

(57) ABSTRACT

In a board production line having multiple work devices arranged to transfer a board from upstream to downstream and perform a predetermined operation on the board, the board production line comprising: a shared folder having storage areas configured to store board-related information, the storage areas being multiply divided according to the number of the work devices, and transferring the board-related information among the storage areas, in conjunction with transferring the board, with a first work device capable of accessing the storage areas among the multiple work devices, and a management proxy section configured to access the shared folder in place of a second work device which cannot access the storage areas, and configured to manage the board-related information so that the board-related information can be transferred among the storage areas.

7 Claims, 8 Drawing Sheets

(51) Int. Cl.
*H05K 13/08* (2006.01)
*H05K 13/00* (2006.01)

(58) Field of Classification Search
USPC .......................................................... 700/121
See application file for complete search history.

(56) References Cited

U.S. PATENT DOCUMENTS

2017/0023931 A1* 1/2017 San ................... G05B 19/4155
2017/0228329 A1* 8/2017 Rachlin ................. G06F 13/28
2020/0096975 A1* 3/2020 Tanizawa ............... H05K 13/00

FOREIGN PATENT DOCUMENTS

| JP | 2000-124676 A | 4/2000 | |
|----|---------------|--------|---|
| JP | 2006-201887 A | 8/2006 | |
| JP | 2007-335911 A | 12/2007 | |
| JP | 2009-105467 A | 5/2009 | |
| JP | 2016-134521 A | 7/2016 | |
| JP | 2017-34009 A | 2/2017 | |
| WO | WO-2015079560 A1 * | 6/2015 | ......... G05B 19/4155 |

* cited by examiner

BASE BOARD PRODUCTION LINE, INFORMATION MANAGEMENT DEVICE, AND INFORMATION MANAGEMENT PROXY DEVICE

TECHNICAL FIELD

The present specification discloses a board production line, an information management device, and an information management proxy device.

BACKGROUND ART

Conventionally, there has been known a board production line in which multiple work devices for performing an operation of mounting a component on a board, and operations related to mounting the component on the board, are arranged along a board conveyance direction. For example, in the board production line of Patent Literature 1, a detection unit for detecting board types is provided in a work device upstream, and a transfer unit for transferring board type information to work devices downstream is provided in each work device, the board type information being made to correspond to the conveyance of boards. The transfer unit also transfers information on quality defects to the downstream work device.

PATENT LITERATURE

Patent Literature 1: Japanese Unexamined Patent Application Publication No. 2000-124676

BRIEF SUMMARY

Technical Problem

In such a board production line, if a work device having no communication function capable of transferring information is disposed, information cannot be properly transferred resulting in cases where the transmission of information is interrupted. In such cases, it becomes impossible to effectively use the information related to board type, quality defects, and the like.

A main object of the present disclosure is to enable effective use of information without interruptions to the transmission of information.

Solution to the Problem

The present disclosure employs the following means to achieve the above-mentioned main object.

The board production line of the present disclosure is a board production line having multiple work devices arranged to transfer a board from upstream to downstream and perform a predetermined operation on the board, the board production line comprising: a shared folder having storage areas configured to store board-related information, the storage areas being multiply divided according to the number of the work devices, and transferring the board-related information among the storage areas, in conjunction with transferring the board, with a first work device capable of accessing the storage areas among the multiple work devices, and a management proxy section configured to access the shared folder in place of a second work device which cannot access the storage areas, and configured to manage the board-related information so that the board-related information can be transferred among the storage areas.

The board production line of the present disclosure includes multiple work devices, a shared folder, and a management proxy section. The shared folder has a storage area for storing board-related information divided into multiple storage areas in accordance with the number of work devices, and the board-related information is transferred between the storage areas along with transferring of the board with the first work device which can access the storage areas. In addition, the management proxy section accesses the shared folder in place of the second work device that cannot access the storage areas, and manages the board-related information so that the board-related information can be transferred between the storage areas. Therefore, even in the case where the board production line includes a second work device which cannot access the storage areas of the shared folder, it is possible to transfer the board-related information between the storage areas. Therefore, since the board-related information can be transmitted without interruption in the storage area divided into multiple storage areas, in conjunction with the transferring of the board between the work devices, so that the board-related information can be effectively used.

DESCRIPTION OF EMBODIMENTS

Figure 1:
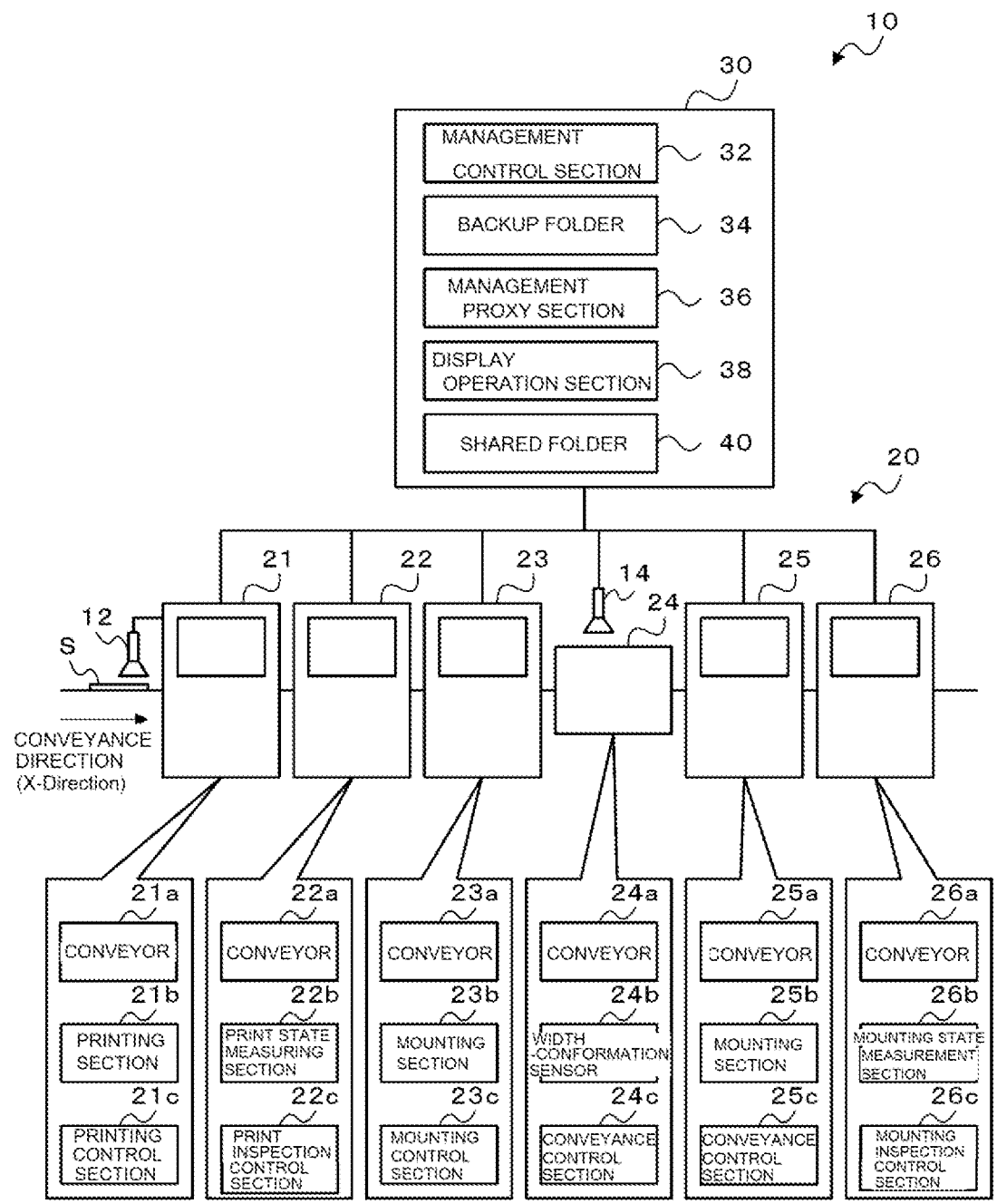
FIG. 1 A diagram showing the configuration of board production line 10.
Figure 2:
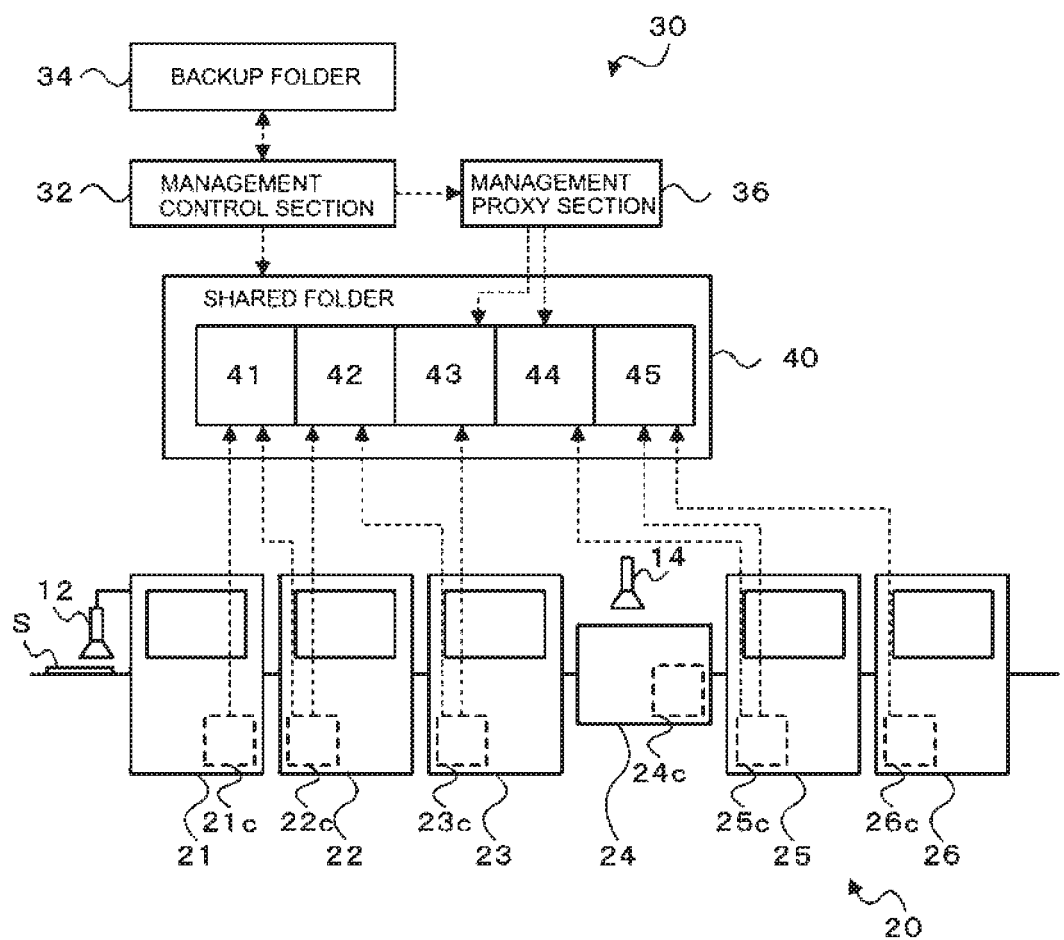
FIG. 2 A diagram showing access to shared folder 40.

Next, an embodiment of the present disclosure will be described with reference to the drawings. FIG. 1 is a diagram showing the configuration of board production line 10, and FIG. 2 is a diagram showing access to shared folder 40. As shown in FIG. 1, board production line 10 includes multiple work devices 20 that perform a predetermined operation on board S, and information management device 30 that manages information regarding board S, which is a work target. The multiple work devices 20 convey in board S from the upstream side (the left side in FIG. 1), perform a predetermined operation, and then convey out board S to the downstream side (the right side in FIG. 1). The conveyance direction of board S (left-right direction in FIG. 1) is the X-direction, the direction orthogonal to the X-direction in the horizontal plane is the Y-direction, and the up-down direction orthogonal to the X-direction and the Y-direction is the Z-direction.

Board production line 10 of the present embodiment includes, as multiple work devices 20, printing device 21, printing inspection device 22, mounting devices 23, 25, conveyance device 24, and mounting inspection device 26.

Work devices 20 in board production line 10 are not limited to these, and other work devices may be provided. Further, it is possible to exchange signals related to the conveyance of board S between adjacent work devices 20.

Board production line 10 includes reading devices 12, 14 for reading board information provided on board S. Board information may be provided as various types of codes such as bar codes or 2D codes, or may be provided as IC chips or the like. Board information includes, for example, board type information indicating the type of board S, board ID information identifying board S, board size information indicating the size of board S and the like. Reading device 12 is provided at the upstream convey-in port of printing device 21, that is, at the most upstream position of board production line 10, and reads information of board S on which the operation starts in board production line 10. Reading device 14 is provided in the vicinity of conveyance device 24 and reads information on board S to be moved in and out of conveyance device 24, as will be described later. Reading devices 12, 14 can be, for example, code readers for reading various codes provided as board information, imaging devices for capturing images of various codes and outputting the images, or IC chip readers for reading an IC chip provided as board information.

Printing device 21 includes conveyor 21a, printing section 21b, and printing control section 21c, and prints solder, which is a viscous fluid, on board S. Conveyor 21a is provided at intervals in the width direction (Y-direction) of board S, and conveys board S with a pair of conveyor belts whose conveying width can be changed. Printing section 21b performs printing by pushing solder into pattern holes in a screen mask with a squeegee. Printing control section 21c controls all of printing device 21 including conveyor 21a and printing section 21b, and is capable of exchanging information with information management device 30 and accessing shared folder 40, which will be described later. Printing control section 21c acquires board information read by reading device 12, and acquires board information from images captured by reading device 12.

Print inspection device 22 includes conveyer 22a, print state measurement section 22b, and print inspection control section 22c, and inspects the printing state of solder on board S. Conveyor 22a is configured in the same manner as conveyor 21a. Print state measurement section 22b measures the printing deviation amount of solder and the like based on images obtained by imaging board S. Print inspection control section 22c controls all of print inspection device 22, exchanges information with information management device 30, and can access shared folder 40.

Mounting device 23 includes conveyor 23a, mounting section 23b, and mounting control section 23c, and arranges (mounts) components on board S. Conveyor 23a is configured in the same manner as conveyor 21a. Mounting section 23b has a suction nozzle for picking up a component by suction, and the suction nozzle is moved from a supply position of the component to a mounting position on board S to mount the component on board S. Mounting control section 23c controls all of mounting device 23, exchanges information with information management device 30, and can access shared folder 40. Like mounting device 23, mounting device 25 includes conveyor 25a, mounting section 25b, and mounting control section 25c.

Conveyance device 24 includes conveyor 24a, width-conformation sensor 24b, and conveyance control section 24c, and is disposed between mounting devices 23, 25 to convey board S from mounting device 23 to mounting device 25. Conveyor 24a is provided at intervals in the width direction of board S, and conveys board S with a pair of conveyor belts whose conveying width can be changed. Width-conformation sensor 24b is attached to the leading end of conveyor 24a so as to detect the position of the conveyor belt of conveyor 23a in mounting device 23 located upstream. Conveyance control section 24c controls all of conveyance device 24, and changes the width of conveyor 24a to conform to the width of conveyor 23a based on the detection signal from width-conformation sensor 24b. In addition, conveyance control section 24c cannot exchange information with information management device 30 and cannot access shared folder 40. Conveyance device 24 can take out board S on conveyor 24a or insert a board onto conveyor 24a by the operation of an operator.

Mounting inspection device 26 includes conveyer 26a, mounting state measurement section 26b, and mounting inspection control section 26c, and inspects the mounting state of components on board S. Conveyor 26a is configured in the same manner as conveyor 21a. Mounting state measurement section 26b measures the mounting deviation amount of components and the like based on images obtained by imaging board S. Mounting inspection control section 26c controls all of mounting inspection device 26, exchanges information with information management device 30, and can access shared folder 40.

Figure 3:
FIG. 3 A diagram showing an example of board information file FL.

As shown in FIG. 1, information management device 30 includes management control section 32, backup folder 34, management proxy section 36, display operation section 38, and shared folder 40. Management control section 32 includes a CPU, a ROM, a RAM, and the like, controls all of information management device 30, and performs information management for each work device 20 of board production line 10. Backup folder 34 is a nonvolatile memory device such as an HDD and stores various types of information that are targeted for backup. Management proxy section 36 accesses shared folder 40 in place of board conveyance device 24 to manage information. Display operation section 38 includes, for example, touch panel, operation buttons, and the like, and displays various types of information to the operator and receives various types of operations from the operator. Shared folder 40 is a nonvolatile memory device such as an HDD, and as shown in FIG. 2, has a total of five storage areas from first to fifth storage areas 41 to 45, and board information file FL (board-related information) is stored in each storage area. FIG. 3 is a diagram showing an example of board information file FL.

First storage area 41 stores board information files FL1 created by printing control section 21c of printing device 21. Printing control section 21c creates board information file FL1 based on a board information file acquired via reading device 12 described above and stores the file in first storage area 41. Print inspection control section 22c of print inspection device 22 can read and recognize board information file FL1 stored in first storage area 41.

Board information file FL2 is stored in second storage area 42 by print inspection control section 22c of print inspection device 22. Print inspection control section 22c creates board information file FL2 in which print result information is added to board information file FL1, read from first storage area 41, and stores board information file FL2 in second storage area 42. Print inspection control section 22c adds, as print result information, a printing position shift amount such as a shift amount Δx in the X-direction, a shift amount Δy in the Y-direction, and a shift amount Δθ in the rotation direction for each position where printing shift occurs, for example. Mounting control section 23c of mounting device 23 can read and recognize board information file FL2 stored in second storage area 42.

Board information file FL3 is stored in third storage area 43 by mounting control section 23c of mounting device 23. Mounting control section 23c creates board information file FL3 in which mounting result information is added to board information file FL2, read from second storage area 42, and stores board information file FL3 in third storage area 43. Mounting control section 23c adds, as mounting result information, for example, information on the mounting position deviation amount of components mounted according to the printing position deviation amount or the like, information on unmounted components when a target component cannot be mounted, height information on mounted components having a relatively high height, information on the protrusion amount of mounted components in the conveyance direction of board S, and the like. The information of the mounting positional deviation amount is information of a positional deviation amount caused by correction at the time of mounting, and includes a deviation amount $\Delta x$ in the X-direction, a deviation amount $\Delta y$ in the Y-direction, a deviation amount $\Delta \theta$ in the rotation direction, and the like. The information of the unmounted component is information on the original mounting position (x, y) and the component type of the unmounted component which cannot be mounted due to falling of the component or the like. The height information of the mounted component is information on the mounting position (x, y) and the height of the mounted component in the case where the interference avoiding operation with the component is necessary in a later step because the height of the mounted component is high. The information on the amount of protrusion of the mounted component is information on the amount of protrusion to the outside of board S in the case where a component such as a connector protrudes from the end of board S in the conveyance direction and is mounted. Management proxy section 36 can read and recognize board information file FL3 stored in third storage area 43.

In fourth storage area 44, board information file FL4 is stored by management proxy section 36 in place of conveyance device 24. Management proxy section 36 stores board information file FL3, read from third storage area 43, in fourth storage area 44 as board-related information file FL4. Mounting control section 25c of mounting device 25 can read and recognize board information file FL4 stored in fourth storage area 44.

In fifth storage area 45, board information file FL5 is stored by mounting control section 25c of mounting device 25. Mounting control section 25c creates board information file FL5 in which mounting result information as described above is added to board information file FL4, read from fourth storage area 44, and stores board information file FL5 in fifth storage area 45. Mounting inspection control section 26c of mounting inspection device 26 can read and recognize board information file FL5 stored in fifth storage area 45.

In addition, management control section 32 can exchange information with each of working devices 20 except for conveyance device 24 (i.e., printing device 21, printing inspection device 22, mounting devices 23, 25, and mounting inspection device 26. Management control section 32 outputs a production start instruction for board S to each work device 20 except for conveyance device 24, and outputs production-related information of board S including solder printing positions, mounting positions for each component, mounting numbers for each component, mounting orders, and the like. Management control section 32 receives the production status of board S from each of work devices 20 except for conveyance device 24 and receives the consumption status of consumables such as solder and components. In addition, management control section 32 stores information in backup folder 34 or shared folder 40, reads information from backup folder 34 or shared folder 40, displays information on display operation section 38, or receives operational contents from display operation section 38.

Figure 4:
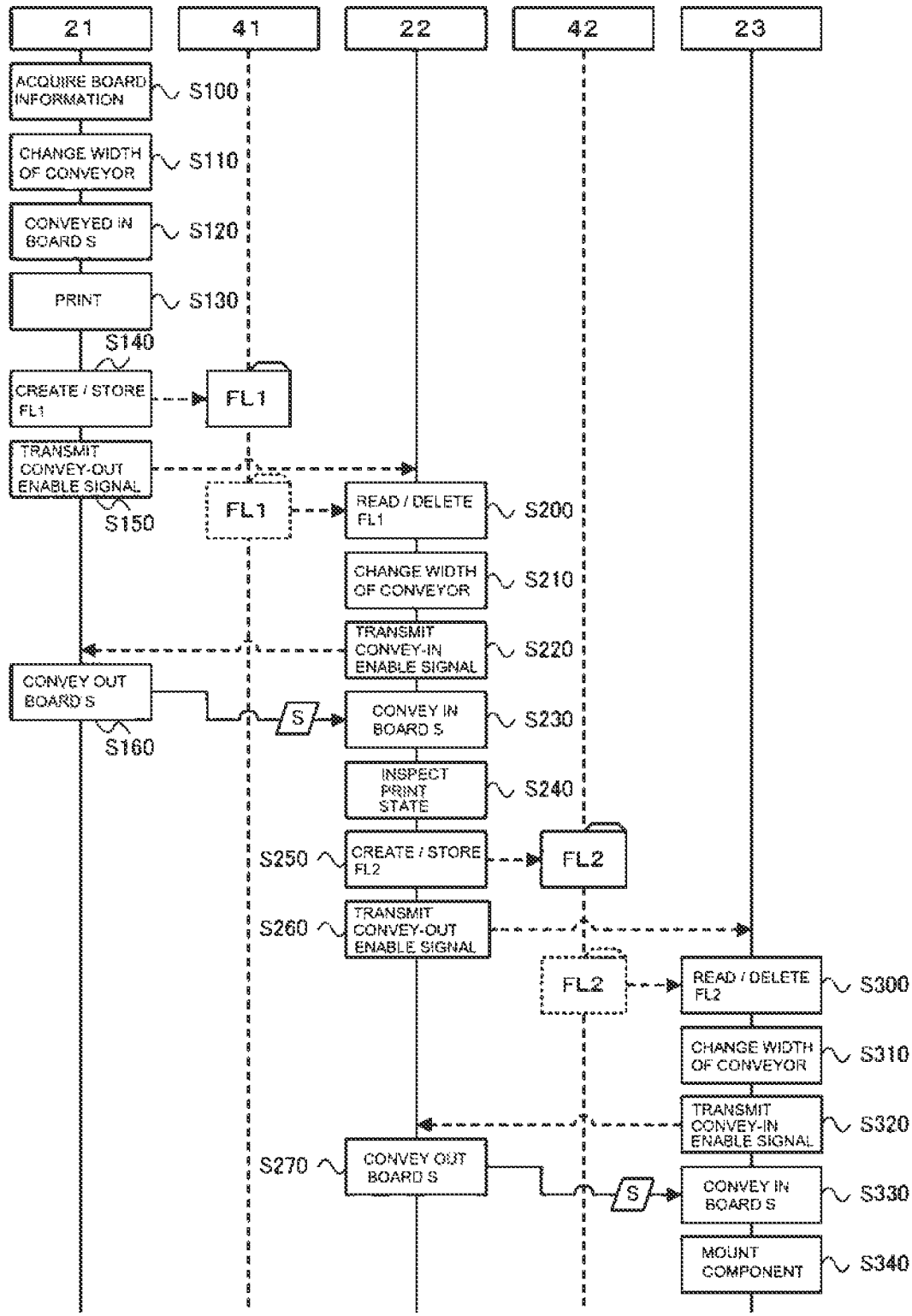
FIG. 4 A diagram showing an example of a delivery of board S and board information file FL.
Figure 5:
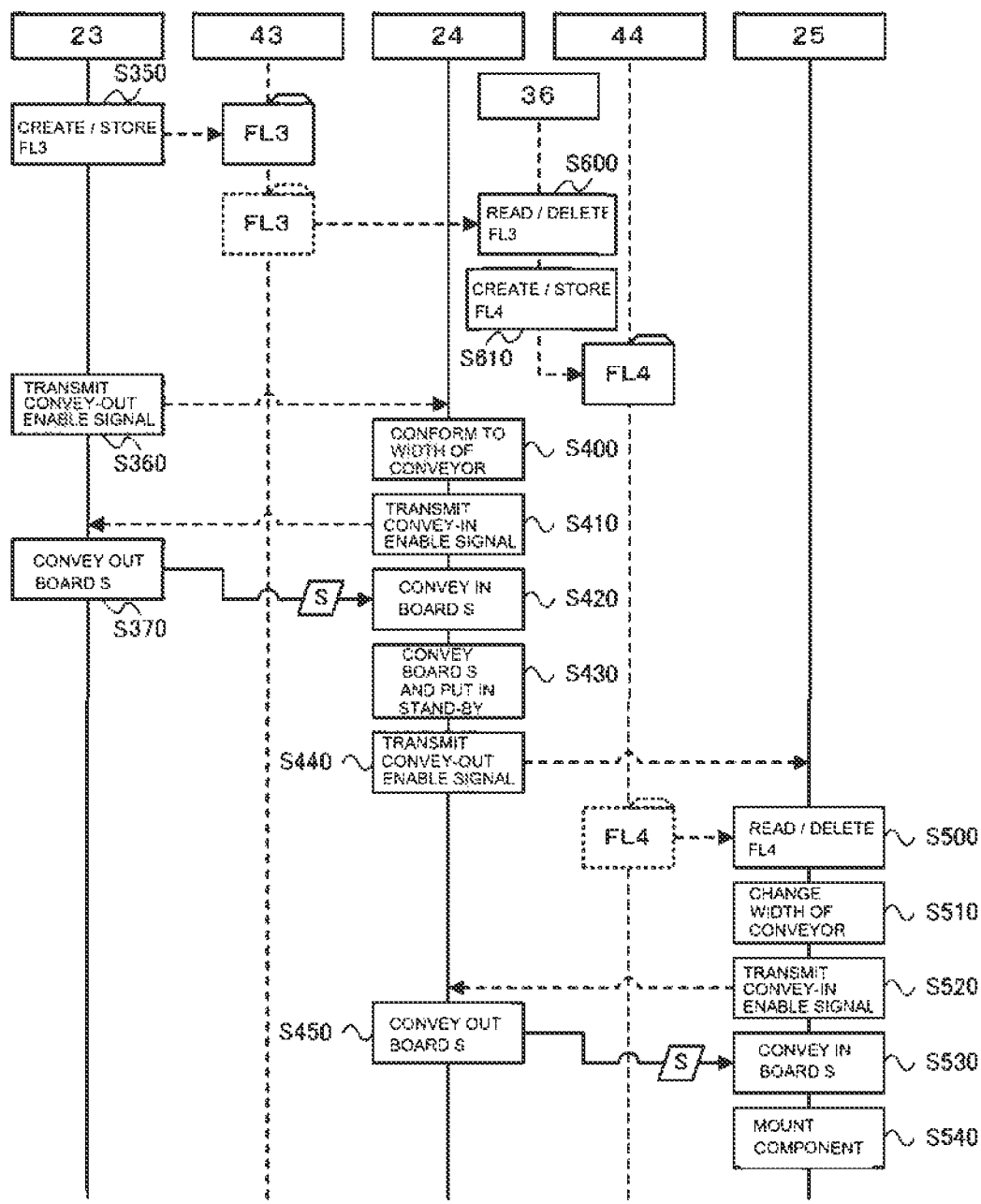
FIG. 5 A diagram showing an example of a delivery of board S and board information file FL.

The following is a description of the operation of board production line 10 of this embodiment thus configured. FIGS. 4 and 5 are diagrams showing an example of the transfer of board S and board information file FL. In FIG. 4, printing device 21, printing inspection device 22, mounting device 23, first storage area 41, and second storage area 42 are shown. In FIG. 5, mounting device 23, conveyance device 24, mounting device 25, third storage area 43, and fourth storage area 44 are shown.

As shown in FIG. 4, printing control section 21c of printing device 21, upon acquiring board information through reading device 12 (S100) and after confirming that board S is not in printing device 21, changes the width of conveyor 21a based on range information of board S included in the board information (S110). Next, printing control section 21c causes conveyor 21a to convey in board S (S120) and controls printing section 21b based on the printing position from production-related information corresponding to the board information so that printing section 21b prints solder on board S (S130). When printing is performed on board S, printing control section 21c creates board information file FL1 including board information acquired in S100, and stores the file in first storage area 41 of shared folder 40 (S140). In addition, printing control section 21c transmits a convey-out enable signal, indicating that board S can be conveyed out, to print inspection device 22 downstream (S150).

Print inspection control section 22c of print inspection device 22, which has received the convey-out enable signal, accesses first storage area 41 of shared folder 40, reads board information file FL1, and deletes board information file FL1 from first storage area 41 (S200). In addition, after confirming that board S is not in print inspection device 22, print inspection control section 22c performs a setup change such as changing the width of conveyor 22a based on width information of board S included in board information file FL1 (S210) and transmits a convey-in enable signal, indicating that board S can be conveyed in, to print device 21 upstream (S220). Printing control section 21c of printing device 21 which has received the convey-in enable signal causes conveyor 21a to convey out board S (S160). In addition, print inspection control section 22c causes conveyor 22a to convey in board S (S230).

Print inspection control section 22c then causes print state measurement section 21b to inspect the print state of board S (S240). Print inspection control section 22c determines whether there is a printing deviation by checking with the printing position included in the production-related information corresponding to the board information, and acquires the printing position deviation amount for each printing deviation position. When the printing condition of board S is inspected, print inspection control section 22c creates board information file FL2 in which the printing result information, such as the printing position shift, is added to the content of board information file FL1, and stores board information file FL2 in second storage area 42 of shared folder 40 (S250). A convey-out enable signal of board S is then transmitted to mounting device 23 downstream (S260).

Mounting control section 23c of mounting device 23, which has received the convey-out enable signal, accesses second storage area 42 of shared folder 40, reads board information file FL2, and deletes board information file FL2 from second storage area 42 (S300). In addition, after confirming that board S is not in mounting device 23, mounting control section 23c performs setup change such as changing the width of conveyor 23a based on width information of board S included in board information file FL2 (S310) and transmits a convey-in enable signal for board S to print inspection device 22 upstream (S320). Print inspection control section 22c of print inspection device 22 which has received the convey-in enable signal causes conveyor 22a to convey out board S (S270). In addition, mounting control section 23c causes conveyor 23a to convey in board S (S330).

Mounting control section 23c then causes mounting section 23b to mount the component on board S (S340). Since mounting control section 23c reads board information file FL2 including the printing position deviation amount, the component can be mounted at the mounting position corrected based on the printing position deviation amount with high accuracy. When a component is mounted on board S, as shown in FIG. 5, mounting control section 23c creates board information file FL3 in which mounting result information is added to board information file FL2, and stores it in third storage area 43 of shared folder 40 (S350). As described above, mounting control section 23c adds, as mounting result information, information on the amount of mounting position deviation of a component, information on unmounted components, information on the height of a mounted component, information on the amount of protrusion of a mounted component, and the like. Next, mounting control section 23c transmits a convey-out enable signal of board S to conveyance device 24 downstream (S360).

After confirming that there are no boards S in conveyance device 24, conveyance control section 24c of conveyance device 24, which has received the convey-out enable signal, changes the width of conveyor 24a to conform to the width of conveyor 23a in mounting device 23 upstream by using width-conformation sensor 24b (S400). Conveyance control section 24c then transmits a convey-in enable signal of board S to mounting device 23 located upstream (S410). Mounting control section 23c of mounting device 23 which has received the convey-in enable signal causes conveyor 23a to convey out board S (S370). In addition, conveyance control section 24c causes conveyor 24a to convey board S (S420), and conveys board S to a predetermined position such as a substantially central position on conveyor 24a and causes board S to stand by (S430). Next, conveyance control section 24c transmits a convey-out enable signal of board S to mounting device 25 located downstream (S440). Since transfer device 24 can cause board S to stand by until transfer device 24 receives a convey-in enable signal from mounting device 25 on the downstream side, transfer device 24 functions as a buffer for board S between mounting devices 23, 25.

On the other hand, when board information file FL3 is stored in third storage area 43 of shared folders 40 by mounting control section 23c, management proxy section 36 accesses third storage area 43, reads board information file FL3, and deletes board information file FL3 from third storage area 42 (S600). In addition, management proxy section 36 creates the read board information file FL3 as board information file FL4 and stores it in fourth storage area 44 (S610). As a result, even if conveyance control section 24c of conveyance device 24 cannot access shared folder 40, board information file FL can be transferred from third storage area 43 to fourth storage area 44.

Mounting control section 25c of mounting device 25 that has received the convey-in enable signal from conveyance device 24 accesses fourth storage area 44 of shared folder 40, reads board information file FL4, and deletes board information file FL4 from fourth storage area 44 (S500). After confirming that board S is not inside mounting device 25, mounting control section 25c performs setup change such as changing the width of conveyor 25a based on width information of board S included in board information file FL4 (S510), and transmits a convey-in enable signal for board S to conveyance device 24 upstream (S520). Conveyance control section 24c of conveyance device 24 which has received the convey-in enable signal causes conveyor 24a to convey out board S (S450). In addition, mounting control section 25c causes conveyor 25a to convey in board S (S530). Incidentally, the mounting result information from board information file FL3 onward includes information on the amount of protrusion of the component in the conveyance direction of board S. Therefore, when mounting control section 25c detects the end position of board S and stops conveyor 25a, it is possible to prevent erroneous detection of the end position and stop board S with high accuracy.

When conveying in board S, mounting control section 25c causes mounting section 25b to mount the component on board S (S540). Mounting control section 25c reads board information file FL4 including information on the amount of positional deviation of printing and the amount of positional deviation of mounting of components, information on unmounted components, height information of mounted components, and the like. Therefore, similarly to mounting device 23, mounting device 25 can mount the component at the mounting position corrected based on the printing position deviation amount with high accuracy. In addition, when there is a post-mounted component to be mounted on the component mounted by mounting device 23 as a component to be mounted by mounting device 25, it is possible to prevent the post-mounted component from being mounted, even though it is not mounted, based on information of the unmounted component. Further, when a component having a relatively high height is mounted on mounting device 23, mounting device 25 can adequately prevent interference with the mounted component when conveying a target component based on the height information of the mounted component. In this manner, since mounting device 25 mounts the component after reading board information file FL including the printing result information and the mounting result information, it is possible to mount the component more properly.

Hereinafter, although not shown, mounting device 25 and mounting inspection device 26 perform the same processing as described above. That is, mounting device 25 creates board information file FL5 obtained by adding the mounting result in mounting device 25 to board information file FL4, stores the board information file in fifth storage area 45, and transmits a convey-out enable signal to mounting inspection device 26. Mounting device 25 then conveys out board S upon receiving a convey-out enable signal from mounting inspection device 26. In addition, when receiving the convey-out enable signal from mounting device 25, mounting inspection device 26 accesses fifth storage area 45 to read and delete board information file FL5, changes the width of conveyor 26a based on the width information of board S in board information file FL5, and then transmits the convey-in enable signal to mounting device 25. Mounting inspection device 26 then conveys in board S conveyed out from mounting device 25 and inspects the mounting state of board S with mounting state measurement section 26b while referring to the information of board information file FL5.

Here, the correspondence between the constituent elements of board production line 10 of the present embodiment and the constituent elements of the board production line of the present disclosure will be described. Work device 20 corresponds to a work device, shared folder 40 corresponds to a shared folder, and management proxy section 35 corresponds to a management proxy section. Among working devices 20, printing device 21, print inspection device 22, mounting devices 23, 25, and mounting inspection device 26 correspond to work devices (first working device) that can access the storage area, and conveyance device 24 corresponds to a working device (second working device) that cannot access the storage area. Conveyors 21a to 26a correspond to a conveyance device, and width-conformation sensor 24b corresponds to a width detector.

In board production line 10 of the present embodiment described above, information management device 30 includes shared folder 40 having multiple storage areas 41 to 45 divided according to the number of work devices 20, and management proxy section 35 that accesses shared folder 40 in place of conveyance device 24 that cannot access shared folder 40. Printing device 21, print inspection device 22, mounting devices 23, 25, and mounting inspection device 26 of work device 20 other than conveyance device 24 can access shared folder 40 to transfer board information file FL between the storage areas. Therefore, even when board production line 10 is provided with conveyance device 24 that cannot access shared folder 40, board information file FL can be transferred between storage areas 41 to 45 without interruption so that board information file FL can be effectively used.

Printing device 21, print inspection device 22, mounting devices 23, 25, and mounting inspection device 26 change the width of conveyors 21a, 22a, 23a, 25a, and 26a and perform various operations based on the width information of board S included in board information file FL. Conveyance device 24 changes the conveying width of conveyor 24a to conform to the conveying width of conveyor 23a of mounting device 23 on the upstream side, without reading board information file FL, and conveys board S. For this reason, even if management proxy section 36 transfers board information file FL in place of conveyance device 24, conveyance device 24 can properly perform the work.

Printing device 21, print inspection device 22, and mounting devices 23, 25 delete board information file FL when reading board information file FL and create board information file FL when performing work and store board information file FL in the storage area. On the other hand, management proxy section 36 reads and deletes board information file FL from third storage area 43 corresponding to conveyance device 24 and stores board information file FL in fourth storage area 44. For this reason, board information file FL can be sequentially stored in the storage area to enable effective use of board information file FL.

The present disclosure is not limited in any way to the above-mentioned embodiments, and it is needless to say that the present disclosure can be implemented in various forms as long as it belongs to the technical scope of the present disclosure.

For example, in the embodiment described above, the case where each work device 20 sequentially transfers board S without taking out or inserting board S by the operator in conveyance device 24 has been exemplified, but the present disclosure is not limited to this. For example, board S may be taken out by the operator or inserted by the operator in conveyance device 24.

Figure 6:
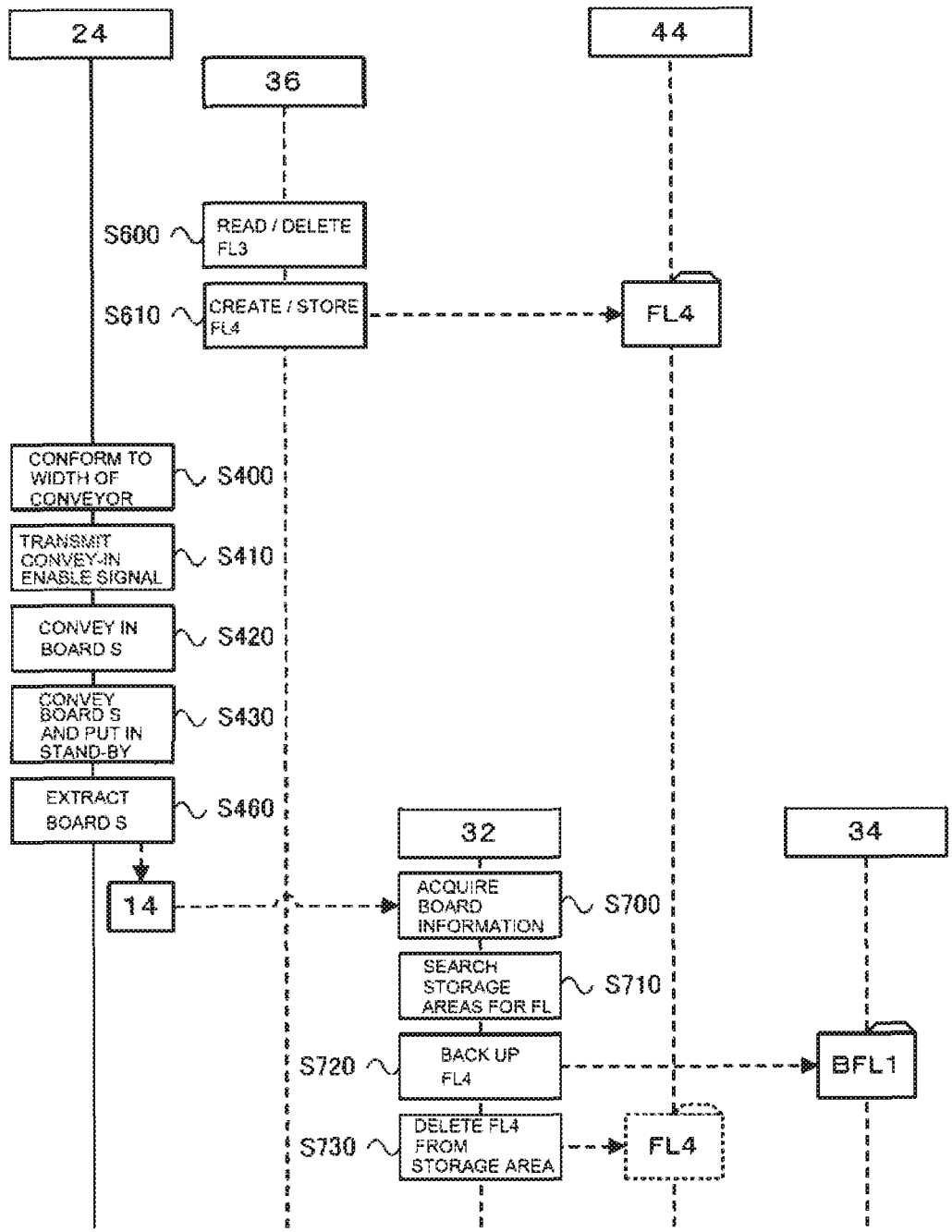
FIG. 6 A diagram showing the transfer of board S and board information file FL in another embodiment.

FIG. 6 shows the transfer of board S and board information file FL when board S is taken out by the operator. In FIG. 6, it is assumed that board S is extracted (S460) by the operator when conveyance device 24 performs the processes of S400 to S430 in the same manner as in the embodiment to causes board S to stand by on conveyor 24a. When extracting board S, the operator causes reading device 14 provided in the vicinity of conveyance device 24 to read the board information of board S. Management control section 32 of information management device 30, upon acquiring the board information (such as the board type information and the board ID information) read by reading device 14 (S700), searches board information file FL corresponding to the board information from third storage area 43 and fourth storage area 44 (S710). In FIG. 6, it is assumed that board information file FL corresponding to the board information acquired by S700 is board information file FL4 in fourth storage area 44. Since board information file FL3 in third storage area 43 corresponds to the process timings of management proxy section 36, management control section 32 searches third storage area 43 and fourth storage area 44 for locating respective board information files FL. Of course, management control section 32 may search all of first to fifth storage areas 41 to 45.

Then, control section 32 backs up board information file FL4 as backup file BFL1 in backup folder 34 (S720), and deletes board information file FL4 from fourth storage area (S730). In this manner, even when board S is taken out from conveyance device 24 that cannot access shared folder 40, board information file FL can be properly deleted from shared folder 40. Therefore, it is possible to prevent board information file FL of board S not on board production line 10 from remaining in shared folder 40, and to properly transfer board information file FL. It should be noted that all or part of the processing of management control section 32 of FIG. 6 may be performed by management proxy section 36.

Figure 7:
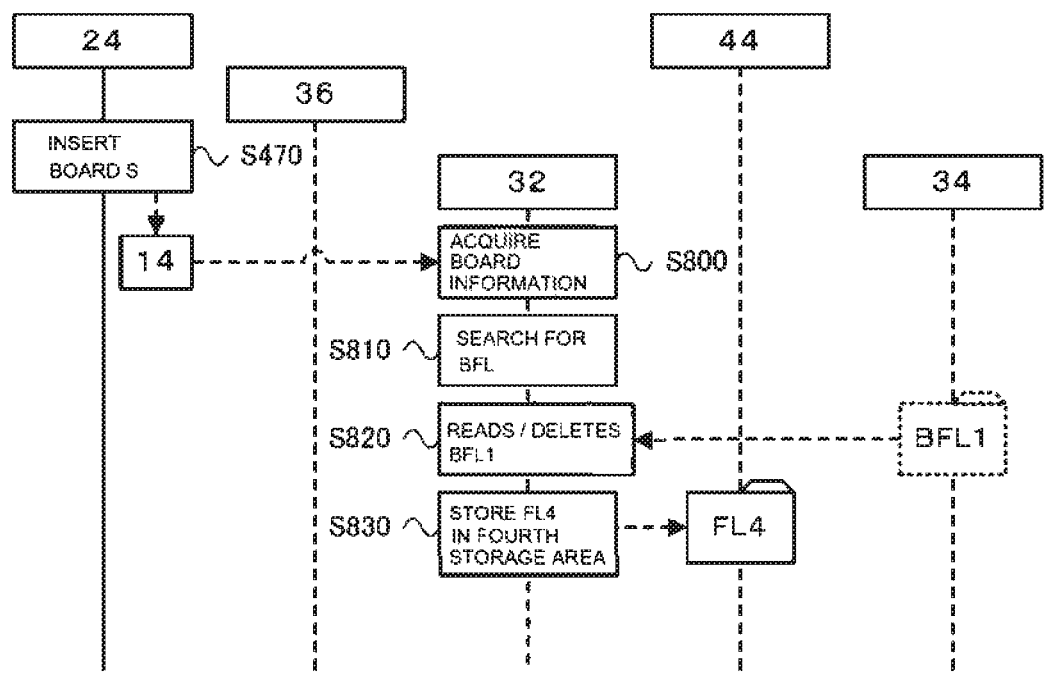
FIG. 7 A diagram showing the transfer of board S and board information file FL in another embodiment.

FIG. 7 shows the transfer of board S and board information file FL when board S is inserted by an operator. In FIG. 7, when there is no board S on conveyor 24a of conveyance device 24, board S is inserted by an operator (S470). When the operator inserts board S, the operator causes reading device 14 to read board information of board S. Management control section 32 of information management device 30, upon acquiring the board information (board type information, board ID information, etc.) read by reading device 14 (S800), searches for backup file BFL, corresponding to the board information, in backup folder 34 (S810). Here, it is assumed that board S backed up in S720 of FIG. 6 is inserted. For example, when it is necessary to inspect board S outside board production line 10, board S may be once taken out and inspected by an operator, and board S may be inserted when there is no problem in the inspection result. Upon searching backup folder 34 and retrieving corresponding backup file BFL1 therefrom, control section 32 reads backup file BFL1, deletes backup file BFL1 from backup folder 34 (S820), and stores the backup file in fourth storage area 44 as board information file FL4 (S830). When the corresponding backup file BFL does not exist in backup folder 34, control section 32 may newly create board information file FL including the board information acquired in S800 and store board information file FL in fourth storage area 44. In this manner, even when board S is inserted into conveyance device 24 that cannot access shared folder 40, board information file FL can be properly added to fourth storage area 44 corresponding to conveyance device 24. Therefore, board information file FL can be properly transferred between the storage areas of shared folder 40 along with the transfer of board S inserted on board production line 10. It should be noted that all or part of the processing of management control section 32 of FIG. 7 may be performed by management proxy section 36.

In the embodiment described above, board information file FL includes board information (board type information, board ID information, board size information) read by reading devices 12, 14, as well as printing result information, mounting result information, and the like performed by each work device 20, but is not limited thereto. For example, board information file FL may include only the board information without including either or both of the print result information and the mounting result information, or may include other information. In order to make effective use of the information in work device 20 on the downstream side, it is preferable to include printing result information and mounting result information.

Figure 8:
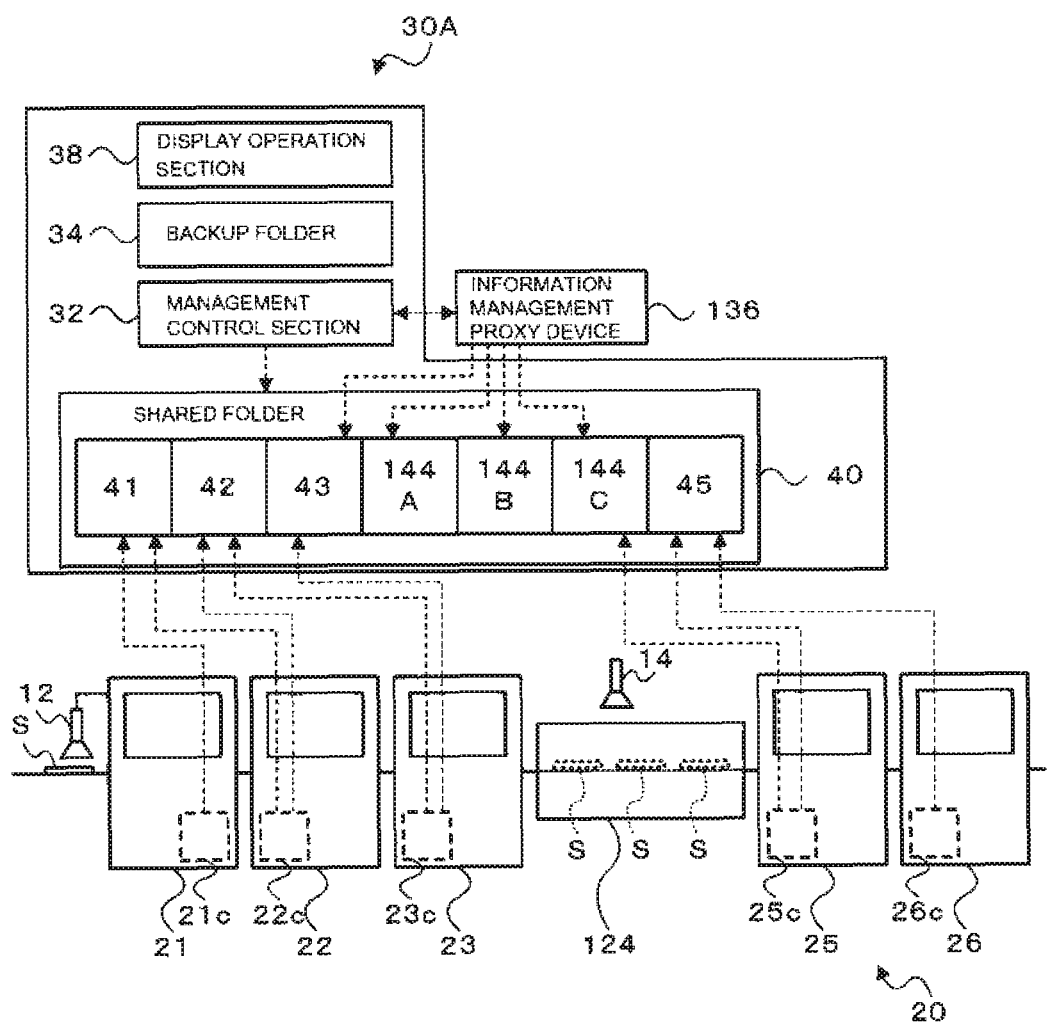
FIG. 8 A diagram showing access to shared folder 40 in another embodiment.

In the embodiment described above, management proxy section 36 is included in information management device 30, but the present disclosure is not limited thereto. For example, as shown in FIG. 8, information management device 30A may not include management proxy section 36, and may be configured as a device different from information management device 30, and may be information management proxy device 136 that accesses the storage area of shared folder 40 in place of work device 20.

In the above-described embodiment, as work device 20 that cannot access the storage area of shared folder 40, conveyance device 24 that conveys board S between mounting machines 23, 25 is exemplified, but the present disclosure is not limited thereto. For example, multiple conveyance devices 24 may be provided, but the conveyance device is not limited to the conveyance device, and the conveyance device may be an inversion device for inverting the front and back sides of board S, or a buffer device having multiple buffer regions that cause multiple boards S to stand by. For example, as shown in FIG. 8, buffer device 124 that causes three boards S to stand by between mounting devices 23, 25 may be used. Each time board S is conveyed in, buffer device 124 sequentially feeds board S to the downstream side in the conveyance direction, that is, the right side in FIG. 8, and causes board S to stand by. Of course, the number of boards that buffer device 124 causes to stand by is not limited to three, and the position of buffer device 124 is not limited to the position between mounting devices 23, 25. When buffer device 124 can causes multiple boards S to stand by, multiple storage areas are provided in accordance with the number of boards S that are able to stand by, as shown in the drawing. Here, three storage areas 144A, 144B, 144C are provided between third storage area 43 and fifth storage area 45. Then, for example, when board information-related file FL (FL3) is stored in third storage area 43, information management proxy device 136 reads and deletes board information file FL and stores board information file FL in storage area 144A. If board information-related file FL is not stored in storage area 144B, information management proxy device 136 reads and deletes board information file FL in storage area 144A and stores it in storage area 144B. Further, if board information-related file FL is not stored in storage area 144C, information management proxy device 136 reads and deletes board information file FL in storage area 144B and stores it in storage area 144C. Board information file FL in storage area 144C is read and deleted by mounting control section 25c of mounting device 25. In this manner, by providing multiple storage areas in accordance with the number of boards S that can be waited for by buffer device 124, it is possible to properly manage board information file FL of each board S standing by in buffer device 124. Although one buffer device has multiple buffer areas, multiple storage areas (two in this case) may be provided in succession when the conveyance device and the reversing device are arranged in succession.

The board production line, the information management device, and the information management proxy device of the present disclosure may be configured as follows.

In the board production line of the present disclosure, the first work device may perform the predetermined operation or a preparatory operation before the predetermined operation based on the board-related information read by accessing the storage area corresponding to itself, and the second work device may perform the predetermined operation or a preparatory operation before the predetermined operation without reading the board-related information. In this case, even if the management proxy section transfers the board-related information in place of the second work device, the second work device can properly execute the predetermined operation or the preparatory operation before the predetermined operation.

In the board production line of the present disclosure, the board-related information may include width information of the board, the multiple work devices each include a conveyance device whose conveying width can be adjusted in accordance with the width of the board, the first work device executes a conveying width adjustment operation of the conveyance device based on width information of the board included in the board-related information as a preparatory operation before the predetermined operation, and the second work device includes a width detector configured to detect the conveying width of the conveyance device included in the work device adjacent to the upstream side, and as a preparatory operation before the predetermined operation, adjusts the conveying width of its own conveyance device to match the conveying width detected by the width detector. In this case, even if the management proxy section transfers the board-related information in place of the second work device, the second work device can transfer the board by properly changing the conveying width of the conveyance device.

In the board production line of the present disclosure, the first work device may delete the board-related information from the storage area corresponding to itself when reading the board-related information, may create the board-related information when performing the predetermined operation and may store the board-related information in the storage area corresponding to the work device adjacent to the downstream side; and the management proxy section may read the board-related information from the storage area corresponding to the second work device and deletes the board-related information, and may store the board-related information in the storage area corresponding to the work device adjacent to the downstream side of the second work device. By doing so, the board-related information can be sequentially stored in the storage area corresponding to the downstream-side work device, thereby ensuring effective use of the board-related information.

The information management device of the present disclosure is an information management device, configured to manage information for a predetermined operation performed on a board, the information management device comprising: a shared folder having storage areas configured to store board-related information, the storage areas being multiply divided according to the number of the work devices, and transferring the board-related information among the storage areas, in conjunction with transferring the board, with a work device capable of accessing the storage areas among the multiple work devices, and a management proxy section configured to access the shared folder in place of a work device which cannot access the storage areas, and configured to manage the board-related information so that the board-related information can be transferred among the storage areas.

The information management device of the present disclosure includes a shared folder and a management proxy section. The shared folder has a storage area for storing board-related information divided into multiple areas in accordance with the number of work devices, and the board-related information is transferred between the storage areas along with the transfer of the board by work devices accessible to the storage area. In addition, the management proxy section accesses the shared folder in place of the work device that is inaccessible to the storage area, and manages the board-related information so as to be transferred between the storage areas. For this reason, even when the board production line includes a work device that is inaccessible to the storage area of the shared folder, it is possible to transfer board-related information between the storage areas. Therefore, similarly to the above-described board production line, board-related information can be transmitted without interruption along with the transfer of the board between the working devices in the storage areas divided into multiple sections so that the board-related information can be effectively used.

The information management proxy device of the present disclosure is an information management proxy device configured to manage information, in place of another device, of a shared folder having a storage area configured to store board-related information, the storage area being divided into multiple storage areas according to the number of work devices, and the work devices being configured to transfer a board and perform a predetermined operation on the board, wherein the shared folder transfers the board-related information among the storage areas, in conjunction with transferring the board, with a work device capable of accessing the storage areas among the multiple work devices, and wherein a management proxy section is configured to access the shared folder in place of a work device which cannot access the storage areas, and configured to manage the board-related information so that the board-related information can be transferred among the storage areas.

The information management proxy device of the present disclosure accesses the shared folder, in place of a work device which cannot access the storage area divided according to the number of work devices into multiple storage areas which store board-related information, and manages board-related information so that the board-related information can be transferred between the storage areas. Therefore, similarly to the above-described board production line, board-related information can be transmitted without interruption along with the transfer of the board between the working devices in the storage areas divided into multiple sections, and therefore, board-related information can be effectively used.

INDUSTRIAL APPLICABILITY

The present disclosure can be applied to a board production line for performing work on a board.

REFERENCE SIGNS LIST

10 Board production line, 12, 14 Reading device, 20 Work device, 21 Printing device, 21a, 22a, 23a, 24a, 25a, 26a Conveyor, 21b Printing section, 21c Printing control section, 22 Print inspection device, 22b Print state measurement section, 22c Print inspection control section, 23, 25 Mounting device 23b, 25b Mounting section 23c, 25c Mounting control section 24 Conveyance device 24b Width-conformation sensor 24c Conveyance control section 26 Mounting inspection device 26b Mounting state measurement section, 26c Mounting inspection control section, 30, 30A Information management device, 32 Management control section, 34 Backup folder, 36 Management proxy section, 38 Display operation section, 40 Shared folder, 41 First storage area, 42 Second storage area, 43 Third storage area, 44 Fourth storage area, 45 Fifth storage area, 124 Buffer device, 136 Information management proxy device, 144A, 144B, 144C Storage area, S Board.

The invention claimed is:

1. A board production line having multiple work devices arranged to transfer a board from upstream to downstream and perform a predetermined operation on the board, the board production line comprising:
   a shared folder having storage areas configured to store board-related information, the storage areas being divided according to a number of the multiple work devices, and the board-related information being transferred among the storage areas in conjunction with transferring the board with a first work device capable of accessing the storage areas among the multiple work devices, and
   a management proxy section configured to access the shared folder in place of a second work device which cannot access the storage areas among the multiple work devices, and configured to manage the board-related information so that the board-related information can be transferred among the storage areas.

2. The board production line of claim 1,
   wherein the first work device is capable of performing the predetermined operation or a preparatory operation before the predetermined operation based on the board-related information read by accessing a corresponding storage area, and
   wherein the second work device is capable of performing the predetermined operation or the preparatory operation before the predetermined operation without reading the board-related information.

3. The board production line of claim 2,
   wherein the board-related information includes width information of the board,
   wherein the multiple work devices each include a conveyance device whose conveying width can be adjusted in accordance with the width information of the board,
   wherein the first work device executes a conveying width adjustment operation of the conveyance device based on the width information of the board included in the board-related information as the preparatory operation before the predetermined operation, and
   wherein the second work device includes a width detector configured to detect the conveying width of the conveyance device included in a work device adjacent to an upstream side among the multiple work devices, and as the preparatory operation before the predetermined operation, adjusts the conveying width of its own conveyance device to match the conveying width detected by the width detector.

4. The board production line of claim 2,
wherein the first work device reads the board-related information corresponding thereto and deletes the board-related information from the corresponding storage area, creates the board-related information when performing the predetermined operation, and stores the board-related information in a storage area corresponding to a work device adjacent to a downstream side among the multiple work devices; and
wherein the management proxy section reads the board-related information from a storage area corresponding to the second work device and deletes the board-related information, and stores the board-related information in a storage area corresponding to a work device adjacent to a downstream side of the second work device among the multiple work devices.

5. The board production line of claim 1,
wherein the first work device reads the board-related information corresponding thereto and deletes the board-related information from a corresponding storage area, creates the board-related information when performing the predetermined operation, and stores the board-related information in a storage area corresponding to a work device adjacent to a downstream side among the multiple work devices; and
wherein the management proxy section reads the board-related information from a storage area corresponding to the second work device and deletes the board-related information, and stores the board-related information in a storage area corresponding to a work device adjacent to a downstream side of the second work device among the multiple work devices.

6. An information management device configured to manage information for a predetermined operation performed on a board, the information management device comprising:
a shared folder having storage areas configured to store board-related information, the storage areas being divided according to a number of work devices, and the board-related information being transferred among the storage areas in conjunction with transferring the board with a work device capable of accessing the storage areas among the multiple work devices, and
a management proxy section configured to access the shared folder in place of a work device which cannot access the storage areas among the work devices, and configured to manage the board-related information so that the board-related information can be transferred among the storage areas.

7. An information management proxy device, configured to manage information, in place of another device, of a shared folder having storage areas configured to store board-related information, the storage areas being divided according to a number of work devices, and the work devices being configured to transfer a board and perform a predetermined operation on the board,
wherein the board-related information is transferred among the storage areas in conjunction with transferring the board with a work device capable of accessing the storage areas among the multiple work devices, and
wherein the information management proxy device is configured to access the shared folder in place of a work device which cannot access the storage areas among the work devices, and configured to manage the board-related information so that the board-related information can be transferred among the storage areas.

* * * * *